(12) United States Patent
Fujikawa et al.

(10) Patent No.: US 7,321,142 B2
(45) Date of Patent: Jan. 22, 2008

(54) FIELD EFFECT TRANSISTOR

(75) Inventors: Kazuhiro Fujikawa, Osaka (JP); Shin Harada, Osaka (JP); Hiroyuki Matsunami, Yawata (JP); Tsunenobu Kimoto, Kyoto (JP)

(73) Assignee: Sumitomo Electric Industries, Ltd., Osaka-shi (JP)

( * ) Notice: Subject to any disclaimer, the term of this patent is extended or adjusted under 35 U.S.C. 154(b) by 342 days.

(21) Appl. No.: 10/544,017

(22) PCT Filed: May 21, 2004

(86) PCT No.: PCT/JP2004/007397

§ 371 (c)(1),
(2), (4) Date: Jul. 29, 2005

(87) PCT Pub. No.: WO2004/112150

PCT Pub. Date: Dec. 23, 2004

(65) Prior Publication Data

US 2006/0113574 A1    Jun. 1, 2006

(30) Foreign Application Priority Data

Jun. 13, 2003   (JP)   ............................ 2003-169475

(51) Int. Cl.
*H01L 29/80* (2006.01)
(52) U.S. Cl. ................. 257/256; 257/487; 257/E29.242
(58) Field of Classification Search ................. 257/256, 257/287, 355, 487, E29.242, E29.258
See application file for complete search history.

(56) References Cited

U.S. PATENT DOCUMENTS 7,023,033 B2 *   4/2006   Harada et al. ............... 257/287
2003/0168704 A1   9/2003   Harada et al.
2004/0164354 A1 *   8/2004   Mergens et al. ............ 257/355

FOREIGN PATENT DOCUMENTS

| JP | 64-031471 | 2/1989 |
|---|---|---|
| JP | 09-074106 | 3/1997 |
| JP | 2000-323499 | 11/2000 |
| JP | 2003-068762 | 3/2003 |
| WO | WO 01/86727 | 11/2001 |

OTHER PUBLICATIONS

S. T. Allen et al., "Frequency and power performance of microwave SiE FET's" Inst. Phys. Conf. Ser., No. 142, Chapter 4, IOP Publishing Ltd, 1995 pp. 761-764.

* cited by examiner

*Primary Examiner*—Mary Wilczewski
*Assistant Examiner*—Paul E Patton
(74) *Attorney, Agent, or Firm*—W. F. Fasse; W. G. Fasse

(57) ABSTRACT

On an SiC single crystal substrate, an electric field relaxation layer and a p− type buffer layer are formed. The electric field relaxation layer is formed between the p− type buffer layer and the SiC single crystal substrate to contact SiC single crystal substrate. On the p− type buffer layer, an n type semiconductor layer is formed. On the n type semiconductor layer, a p type semiconductor layer is formed. In the p type semiconductor layer, an n+ type source region layer and an n+ type drain region layer are formed separated by a prescribed distance from each other. At a part of the region of p type semiconductor layer between the n+ type source region layer and the n+ type drain region layer, a p+ type gate region layer is formed.

4 Claims, 5 Drawing Sheets

FIELD EFFECT TRANSISTOR

TECHNICAL FIELD

The present invention relates to a field effect transistor, and particularly, to a field effect transistor in which dielectric breakdown is suppressed.

BACKGROUND ART

In a junction field effect transistor, a reverse bias voltage is applied from a gate electrode to a pn junction provided at the side of a channel region through which carriers pass so that a depletion layer extending from the pn junction spreads to the channel region. Thus, the conductance of the channel region is controlled and a switching operation is performed.

Among such junction field effect transistors, there is a lateral field effect transistor, in which carriers in the channel region move parallel to the surface of the device. Here, as an exemplary lateral field effect transistor, a lateral field effect transistor disclosed in Japanese Patent Laying-Open No. 2003-68762 is described.

As shown in FIG. 11, on an SiC single crystal substrate 101, a p− type semiconductor layer 102 is formed. On p− type semiconductor layer 102, an n type semiconductor layer 103 is formed. On n type semiconductor layer 103, a p type semiconductor layer 110 is formed.

In p type semiconductor layer 110, an n+ type source region layer 104, a p+ type gate region layer 106 and an n+ type drain region layer 105 are formed separated by a prescribed distance from one another.

On n+ type source region layer 104, p+ type gate region layer 106 and n+ type drain region layer 105, a source electrode 107, a gate electrode 109 and a drain electrode 108 are formed, respectively.

On the other hand, the above-described conventional lateral field effect transistor involves the following problem. In a state where the field effect transistor is off, when a positive voltage is applied to drain region layer 105 through drain electrode 108, as shown in FIG. 11, depletion layer 121 extends between drain region layer 105 and gate region layer 106, as well as from the interface between p− type semiconductor layer 102 and n type semiconductor layer 103 positioned immediately below drain region layer 105 toward the interface between SiC single crystal substrate 101 and p− type semiconductor layer 102.

Here, as shown in FIG. 11, crystal defects 120 exist in relatively large numbers at the interface between SiC single crystal substrate 101 and p− type semiconductor layer 102. Therefore, the dielectric breakdown voltage in this portion is lower than that in a region that is fully separated from the region containing many crystal defects.

As a result, a problem is invited that the dielectric breakdown easily occurs when an edge of depletion layer 121 reaches near SiC single crystal substrate 101.

DISCLOSURE OF THE INVENTION

The present invention has been made to solve the above-described problem, and an object thereof is to provide a field effect transistor in which dielectric breakdown is suppressed.

A field effect transistor according to the present invention includes: a semiconductor substrate having a main surface; a first semiconductor layer of a first conductivity type; a second semiconductor layer of a second conductivity type; a third semiconductor layer of the first conductivity type; a pair of source and drain region layers; and a gate region layer. The first semiconductor layer of the first conductivity type is formed on the main surface of the semiconductor substrate. The second semiconductor layer of the second conductivity type is formed on the first semiconductor layer. The third semiconductor layer of the first conductivity type is formed on the second semiconductor layer. The pair of source and drain region layers are formed in the third semiconductor layer separated by a prescribed distance from each other. The gate region layer is formed at a part of a region of the third semiconductor layer between the pair of source and drain region layers. The first semiconductor layer includes a buffer layer formed on a side where the third semiconductor layer is positioned and having a first impurity concentration, and an electric field relaxation layer formed at a region between the buffer layer and the semiconductor substrate so as to contact the semiconductor substrate and having a second impurity concentration being higher than the first impurity concentration.

With this configuration, in a state where the field effect transistor is off, when a positive voltage is applied to the drain region layer, the depletion layer extends between the drain region layer and the gate region layer, as well as from the interface between the buffer layer and the second semiconductor layer positioned immediately below the drain region layer toward the semiconductor substrate. Here, since the electric field relaxation layer is formed so as to contact the surface of the semiconductor substrate, crystal defects existing in relatively large numbers at the interface between the semiconductor substrate and the electric field relaxation layer are positioned in the electric field relaxation layer. Since the second impurity concentration of the electric field relaxation layer is set higher than the first impurity concentration of the buffer layer, extension of the depletion layer toward semiconductor substrate is suppressed by the electric field relaxation layer. Thus, an edge of the depletion layer does not reach near the interface between the semiconductor substrate and the electric field relaxation layer containing crystal defects in relatively large numbers, and as a result, dielectric breakdown can be prevented.

In order to set the field intensity at the interface between the electric field relaxation layer and the semiconductor substrate smaller than the field intensity at which the buffer layer undergoes dielectric breakdown, preferably the second impurity concentration of the electric field relaxation layer is set five times higher than the first impurity concentration of the buffer layer.

In order to form the electric field relaxation layer as thin as possible to improve productivity, and to ensure the function of suppressing extension of the depletion layer, preferably the second impurity concentration of the electric field relaxation layer is set at least ten times higher than the first impurity concentration of the buffer layer.

Further, in order to keep the width of the depletion layer to maintain dielectric strength, preferably the thickness of the field electric relaxation layer is as thin as possible, and the ratio of thickness of the electric field relaxation layer to thickness of the buffer layer is set at most at the reciprocal of the ratio of the second impurity concentration to the first impurity concentration.

BEST MODES FOR CARRYING OUT THE INVENTION

In the following, a junction field effect transistor according to an embodiment of the present invention will be described.

Figure 1:
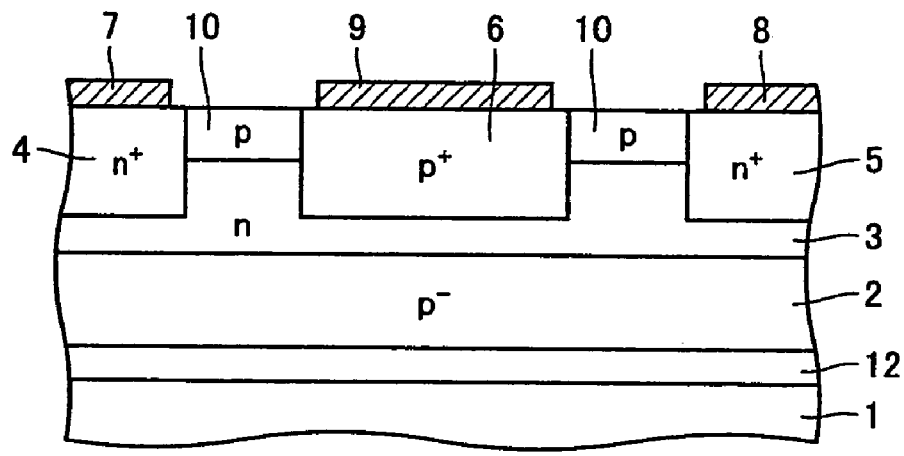
FIG. 1 is a cross-sectional view of a junction field effect transistor according to an embodiment of the present invention.

As shown in FIG. 1, on an SiC single crystal substrate 1, an electric field relaxation layer 12 and a p− type buffer layer 2 as a first semiconductor layer are formed. Specifically, electric field relaxation layer 12 is formed between p− type buffer layer 2 and SiC single crystal substrate 1 so as to contact SiC single crystal substrate 1.

On p− type buffer layer 2, an n type semiconductor layer 3 as a second semiconductor layer is formed. On n type semiconductor layer 3, a p type semiconductor layer 10 as a third semiconductor layer is formed.

In p type semiconductor layer 10, an n+ type source region layer 4 and an n+ type drain region layer 5 are formed separated by a prescribed distance from each other. At a part of the region of p type semiconductor layer 10 between n+ type source region layer 4 and n+ type drain region layer 5, a p+ type gate region layer 6 is formed.

On n+ type source region layer 4, p+ type gate region layer 6 and n+ type drain region layer 5, a source electrode 7, a gate electrode 9 and a drain electrode 8 are formed, respectively.

Figure 2:
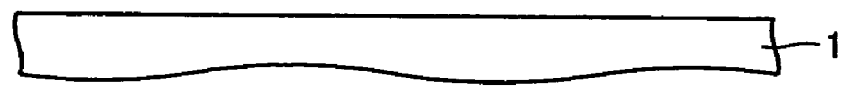
FIG. 2 is a cross-sectional view representing one step of a manufacturing method of the field effect transistor shown in FIG. 1 according to the embodiment.

Next, one example of a manufacturing method of the above-described field effect transistor is described. First, as shown in FIG. 2, SiC single crystal substrate 1 having a main surface is prepared. It is noted that the conductivity type of SiC single crystal substrate 1 is not specified.

Figure 3:
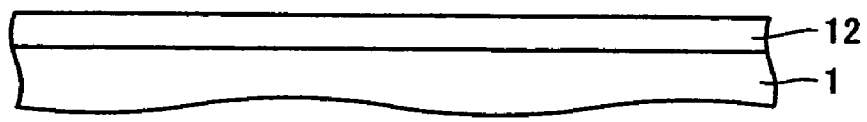
FIG. 3 is a cross-sectional view representing a step to be performed subsequently to the step of FIG. 2 according to the embodiment.

Next, as shown in FIG. 3, electric field relaxation layer 12 is formed on the surface of SiC single crystal substrate 1 at a temperature of about 1500° C. by CVD (Chemical Vapor Deposition). Here, monosilane ($SiH_4$) and propane ($C_3H_8$) are used as material gases, diborane ($B_2H_6$) is used as an impurity doping gas, and hydrogen ($H_2$) is used as a carrier gas.

Figure 4:
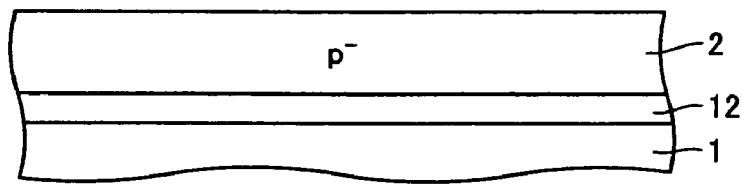
FIG. 4 is a cross-sectional view representing a step to be performed subsequently to the step of FIG. 3 according to the embodiment.

Next, as shown in FIG. 4, p− type buffer layer 2 is formed on electric field relaxation layer 12 by CVD using similar gases. In this case, the gases are used by the flow rates different from those in forming electric field relaxation layer 12.

Figure 5:
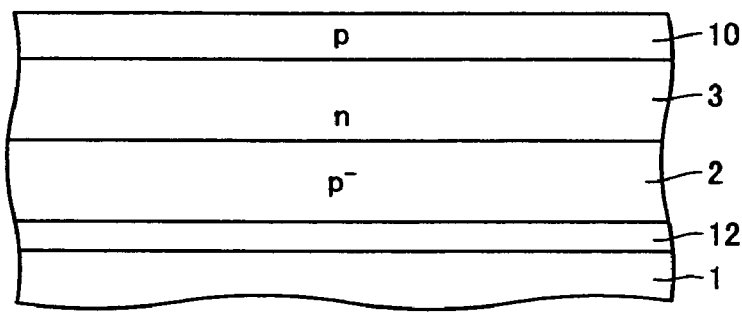
FIG. 5 is a cross-sectional view representing a step to be performed subsequently to the step of FIG. 4 according to the embodiment.

Next, as shown in FIG. 5, n type semiconductor layer 3 is formed on p− type buffer layer 2 at a temperature of about 1500° C. by CVD. Here, monosilane ($SiH_4$) and propane ($C_3H_8$) are used as material gases, nitrogen ($N_2$) is used as an impurity doping gas, and hydrogen ($H_2$) is used as a carrier gas.

Thereafter, p type semiconductor layer 10 is further formed on n type semiconductor layer 3 at a temperature of about 1500° C. by CVD. Here, monosilane ($SiH_4$) and propane ($C_3H_8$) are used as material gases, diborane ($B_2H_6$) is used as an impurity doping gas, and hydrogen ($H_2$) is used as a carrier gas.

Figure 6:
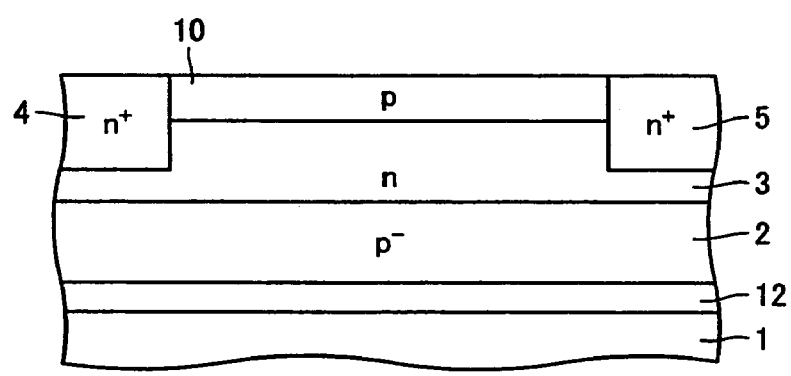
FIG. 6 is a cross-sectional view representing a step to be performed subsequently to the step of FIG. 5 according to the embodiment.

Next, a prescribed resist pattern (not shown) is formed on p type semiconductor layer 10. Using the resist pattern as a mask, by implanting phosphorus (P) at a temperature of 300° C. by ion implantation, n+ type source region layer 4 and n+ type drain region layer 5 are formed separated by a prescribed distance from each other as shown in FIG. 6. Thereafter, the resist pattern is removed.

Figure 7:
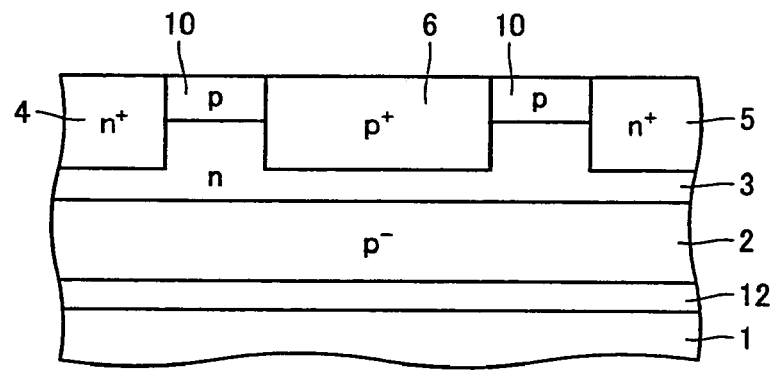
FIG. 7 is a cross-sectional view representing a step to be performed subsequently to the step of FIG. 6 according to the embodiment.

Next, on p type semiconductor layer 10, a prescribed resist pattern (not shown) is formed. Using the resist pattern as a mask, by implanting aluminum (Al) at a temperature of 300° C. by ion implantation, p+ type gate region layer 6 is formed at a region between n+ type source region layer 4 and n+ type drain region layer 5 as shown in FIG. 7. Thereafter, the resist pattern is removed.

Next, a prescribed conductive layer (not shown) is formed on p type semiconductor layer 10 so as to cover n+ source region layer 4, p+ type gate region layer 6 and n+ type drain region layer 5.

Figure 8:
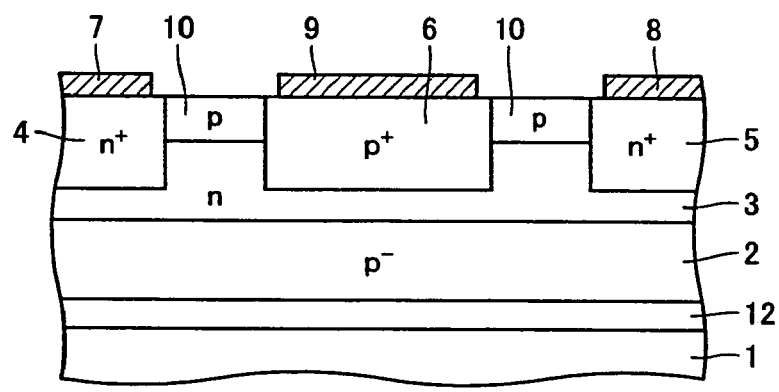
FIG. 8 is a cross-sectional view representing a step to be performed subsequently to the step of FIG. 7 according to the embodiment.

By providing a prescribed photolithography process and working to the conductive layer, source electrode 7, gate electrode 9 and drain electrode 8 are formed on n+ type source region layer 4, p+ type gate region layer 6 and n+ type drain region layer 5 as shown in FIG. 8, respectively. Thus, the field effect transistor shown in FIG. 1 is completed.

In the above-described field effect transistor, dielectric breakdown is suppressed particularly because electric field relaxation layer 12 is formed between p− type buffer layer 2 and SiC single crystal substrate 1 so as to contact SiC single crystal substrate 1. This is further described in the following.

Figure 9:
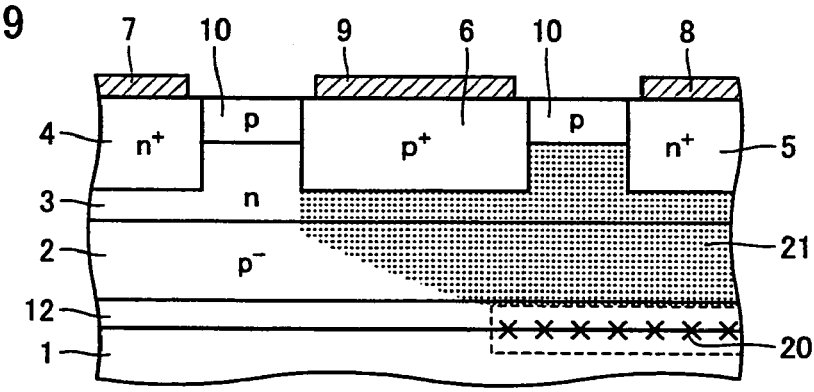
FIG. 9 is a cross-sectional view representing a depletion layer for describing the effect of the field effect transistor according to the embodiment.

In a state where the field effect transistor is off, when a positive voltage is applied to drain region layer 5 through drain electrode 8, as shown in FIG. 9, depletion layer 21 extends between drain region layer 5 and gate region layer 6, as well as from the interface between p− type buffer layer 2 and n type semiconductor layer 3 positioned immediately below drain region layer 5 toward SiC single crystal substrate 1.

As shown in FIG. 9, in this field effect transistor, since electric field relaxation layer 12 is formed so as to contact the surface of SiC single crystal substrate 1, crystal defects 20 existing in relatively large numbers at the interface between SiC single crystal substrate 1 and electric field relaxation layer 12 are positioned in electric field relaxation layer 12.

The impurity concentration of electric field relaxation layer 12 is set higher than the impurity concentration of p-type buffer layer 2. Accordingly, extension of the depletion layer toward SiC single crystal substrate 1 is suppressed by electric field relaxation layer 12.

Thus, an edge of depletion layer 21 does not reach near the interface between SiC single crystal substrate 1 and electric field relaxation layer 12 containing crystal defects in relatively large numbers, and dielectric breakdown can be prevented.

Figure 10:
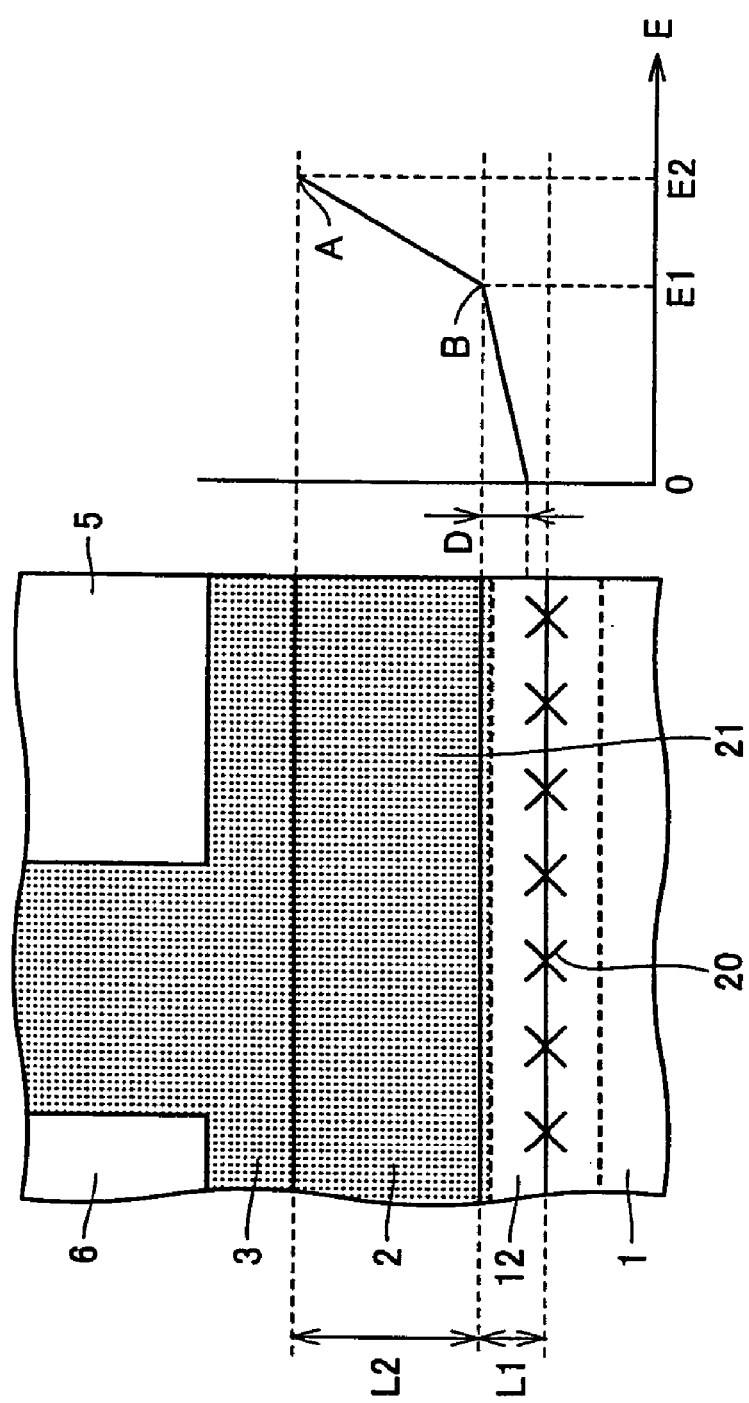
FIG. 10 is an illustration representing a profile of field intensity for describing the effect of the field effect transistor according to the embodiment.
Figure 11:
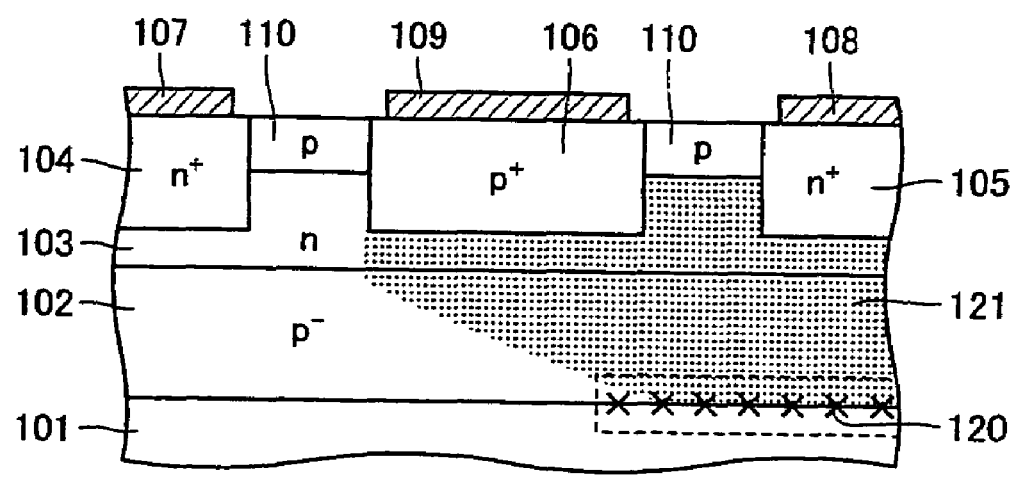
FIG. 11 is a cross-sectional view showing a conventional field effect transistor.

This is specifically described in detail. FIG. 10 is a graph showing the field intensity of electric field relaxation layer 12 and p– type buffer layer 2 of the field effect transistor in a depth direction.

In the field effect transistor shown in FIG. 10, when thickness L1 of electric field relaxation layer 12 is 0.5 μm, impurity concentration (second impurity concentration) C1 is $1 \times 10^{17}/cm^3$, thickness L2 of p– type buffer layer 2 is 5.0 μm, impurity concentration (first impurity concentration) C2 is $1 \times 10^{16}/cm^3$, and a voltage of 600V is applied to drain region layer 5, the field intensity at a surface (A) of p– type buffer layer 2 facing to n type semiconductor layer 3 is about $1.6 \times 10^6 V/cm$.

The field intensity at an interface (B) between electric field relaxation layer 12 and p– type buffer layer 2 is about $0.7 \times 10^6 V/cm$. Further, the field intensity is substantially zero at a position in electric field relaxation layer 12 away from the interface between electric field relaxation layer 12 and p– type buffer layer 2 by about 0.35 μm (distance D).

When only impurity concentration C1 of electric field relaxation layer 12 is changed among the conditions above, i.e., in a state where thickness L1 of electric field relaxation layer 12 is 0.5 μm, thickness L2 of p– type buffer layer 2 is 5.0 μm, and impurity concentration C2 is $1 \times 10^{16}/cm^3$, while impurity concentration C1 is changed, the field intensity at the interface between electric field relaxation layer 12 and SiC single crystal substrate 1 when a voltage of 600V is applied to drain region layer 5 is as follows.

First, when impurity concentration C1 of electric field relaxation layer 12 is the same as impurity concentration C2 of p– type buffer layer 2 ($1 \times 10^{16}/cm^3$), the field intensity is about $0.6 \times 10^6 V/cm$. Next, when impurity concentration C1 of electric field relaxation layer 12 is four times higher than impurity concentration C2 of p– type buffer layer 2 ($4 \times 10^{16}/cm^3$), the field intensity is about $0.3 \times 10^6 V/cm$.

Next, when impurity concentration C1 of electric field relaxation layer 12 is five times higher than impurity concentration C2 of p– type buffer layer 2 ($5 \times 10^{16}/cm^3$), the field intensity is about $0.2 \times 10^6 V/cm$. When impurity concentration C1 of electric field relaxation layer 12 is seven times higher than impurity concentration C2 of p– type buffer layer 2 ($7 \times 10^{16}/cm^3$), the field intensity is substantially 0 V/cm. Thus, as impurity concentration C1 of electric field relaxation layer 12 is increased relative to impurity concentration C2 of p– type buffer layer 2, the field intensity at the interface between electric field relaxation layer 12 and SiC single crystal substrate 1 decreases.

When impurity concentration C1 of electric field relaxation layer 12 is ten times higher than impurity concentration C2 of p– type buffer layer 2 ($1 \times 10^{17}/cm^3$), as described above, the field intensity is substantially zero at a position in electric field relaxation layer 12 away from the interface between electric field relaxation layer 12 and p– type buffer layer 2 by about 0.35 μm (distance D).

On the other hand, in a field effect transistor without electric field relaxation layer 12 and to which a p– type buffer layer of about 5.5 μm thickness is directly formed at a surface of SiC single crystal substrate 1 (Comparative Example), the field intensity at the interface between the p– type buffer layer and SiC single crystal substrate 1 is $0.6 \times 10^6 V/cm$.

The field intensity at which p– type buffer layer 2 undergoes dielectric breakdown is about $3.0 \times 10^6 V/cm$. Preferably, the field intensity at the interface between electric field relaxation layer 12 and SiC single crystal substrate 1 is smaller than 1/10 of this field intensity. Further preferably, the field intensity in electric field relaxation layer 12 is substantially zero. In other words, it is further preferable that both the field intensity at the portion of electric field relaxation layer 12 positioned near the interface between SiC single crystal substrate 1 and the field intensity at the portion of electric field relaxation layer 12 positioned fully away from the interface are substantially zero.

Preferably, from the relationship relative to the field intensity at the interface between electric field relaxation layer 12 and SiC single crystal substrate 1 described above, impurity concentration C1 of electric field relaxation layer 12 is set five times, and more preferably ten times, higher than impurity concentration C2 of p– type buffer layer 2, in order to make the field intensity at the interface between electric field relaxation layer 12 and SiC single crystal substrate 1 smaller than 1/10 of the field intensity at which p– type buffer layer 2 undergoes dielectric breakdown (about $3.0 \times 10^6 V/cm$).

According to an experiment, it was found that, in a junction field effect transistor in which thickness L1 of electric field relaxation layer 12 is 0.5 μm, thickness L2 of p– type buffer layer 2 is 5.0 μm, and impurity concentration C2 is $1 \times 10^{16}/cm^3$, when impurity concentration C1 of electric field relaxation layer 12 is set as the same as impurity concentration C2 of p– type buffer layer 2 ($1 \times 10^{16}/cm^3$), a dielectric strength voltage between drain and source was about 400V.

In contrast, it was also found that a dielectric strength voltage between drain and source was about 720V when impurity concentration C1 of electric field relaxation layer 12 was set ten times higher than impurity concentration C2 of p– type buffer layer 2 ($1 \times 10^{17}/cm^3$). Thus, it was found that the dielectric strength voltage was largely improved.

When boron is used as an impurity in forming electric field relaxation layer 12, great many crystal defects are generated if the impurity concentration exceeds about $1 \times 10^{19}/cm^3$ (solid solubility limit). Accordingly, it is not preferable to set the impurity concentration of electric field relaxation layer 12 exceeding this value.

As described above, in the present field effect transistor as compared to the field effect transistor of Comparative Example, extension of the depletion layer is suppressed by provision of electric field relaxation layer 12, and the field intensity of substantially zero can be attained in electric field relaxation layer 12.

Thus, the field intensity can be suppressed low near the interface between SiC single crystal substrate 1 and electric field relaxation layer 12 where the density of crystal defects is relatively high and the dielectric breakdown electric field is low, whereby dielectric breakdown due to crystal defects in the field effect transistor can be prevented.

Given that the impurity concentration of electric field relaxation layer 12 is α times higher than the impurity concentration of p– type buffer layer 2, extension of the depletion layer in electric field relaxation layer 12 is about 1/α of extension of the depletion layer in a case where the impurity concentration of electric field relaxation layer 12 is set as the same as the impurity concentration of p– type buffer layer 2.

Further, since field intensity is relatively high in p– type buffer layer 2, defects are likely to be generated and dielectric breakdown occurs if the impurity concentration is high. Accordingly, it is not preferable to set the impurity concentration of p– type buffer layer 2 at a relatively high value. An attempt to relax the electric field only with such a p– type buffer layer 2 necessitates a thicker p– type buffer layer 2, reducing the productivity.

With the field effect transistor described above, by provision of electric field relaxation layer 12 having an impurity concentration higher than that of p– type buffer layer 2 as an epitaxial layer in which crystal defects present in relatively large numbers near the interface between SiC single crystal substrate 1, extension of the depletion layer can be suppressed to prevent dielectric breakdown, without increasing the thickness of p– type buffer layer 2.

In other words, from the viewpoint of productivity, by provision of electric field relaxation layer 12 in addition to p– type buffer layer 2, the thickness of p– type buffer layer 2 and electric field relaxation layer 12 as a whole can be reduced and the productivity can be improved.

From the viewpoint of designing, preferably electric field relaxation layer 12 and p– type buffer layer 2 are formed so as to clearly attain their respective functions of preventing extension of the depletion layer to the interface between SiC single crystal substrate 1 and the electric field relaxation layer and ensuring dielectric strength.

To this end, considering the total amount of ionized acceptors, preferably such a relationship is satisfied that the total amount of p– type buffer layer 2 (L2×C2) is greater than the total amount of electric field relaxation layer 12 (L1×C1).

In other words, the ratio of thickness L1 of electric field relaxation layer 12 to thickness L2 of p– type buffer layer 2 (L1/L2) may be set at most at the reciprocal of the ratio of impurity concentration C1 of electric field relaxation layer 12 to impurity concentration C2 of p– type buffer layer 2 (C1/C2).

From the foregoing, in order to form electric field relaxation layer 12 as thin as possible to improve productivity, and to ensure the function of suppressing extension of the depletion layer, preferably the impurity concentration of electric field relaxation layer 12 is set at least ten times higher than the impurity concentration of p– type buffer layer 2.

While a junction field effect transistor has exemplary been described as the field effect transistor, it can be applied to an MO (Metal Oxide) field effect transistor or the like, as long as it is a lateral field effect transistor.

It should be understood that the embodiment disclosed herein is illustrative and non-restrictive in every respect. The scope of the present invention is defined by the terms of the claims, rather than the description above, and is intended to include any modifications within the scope and meaning equivalent to the terms of the claims.

INDUSTRIAL APPLICABILITY

The present invention is effectively applied to a switching power source, an inverter of an automobile or the like, as a power field effect transistor.

The invention claimed is:

1. A field effect transistor, comprising:
a semiconductor substrate having a main surface;
a first semiconductor layer of a first conductivity type formed on the main surface of said semiconductor substrate;
a second semiconductor layer of a second conductivity type formed on said first semiconductor layer;
a third semiconductor layer of the first conductivity type formed on said second semiconductor layer;
a pair of source and drain region layers formed in said third semiconductor layer separated by a prescribed distance from each other; and
a gate region layer formed at a part of a region of said third semiconductor layer between said pair of source and drain region layers, wherein
said first semiconductor layer includes
a buffer layer formed on a side where said third semiconductor layer is positioned and having a first impurity concentration, and
an electric field relaxation layer formed at a region between said buffer layer and said semiconductor substrate so as to contact said semiconductor substrate and having a second impurity concentration being higher than said first impurity concentration.

2. The field effect transistor according to claim 1, wherein said second impurity concentration is set five times higher than said first impurity concentration.

3. The field effect transistor according to claim 2, wherein said second impurity concentration is set at least ten times higher than said first impurity concentration.

4. The field effect transistor according to claim 1, wherein a ratio of thickness of said electric field relaxation layer to thickness of said buffer layer is set at most at a reciprocal of a ratio of said second impurity concentration to said first impurity concentration.

* * * * *